United States Patent
Coutts et al.

(10) Patent No.: US 9,638,743 B2
(45) Date of Patent: May 2, 2017

(54) STATE-DEPENDENT CAPACITANCE ESTIMATION

(71) Applicant: QUALCOMM Incorporated, San Diego, CA (US)

(72) Inventors: Ryan Michael Coutts, Carlsbad, CA (US); Mohamed Waleed Allam, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 409 days.

(21) Appl. No.: 14/157,498

(22) Filed: Jan. 16, 2014

(65) Prior Publication Data

US 2015/0198657 A1    Jul. 16, 2015

(51) Int. Cl.
| | |
|---|---|
| *G01R 31/28* | (2006.01) |
| *G01R 27/26* | (2006.01) |
| *G06F 1/26* | (2006.01) |
| *G06F 1/32* | (2006.01) |
| *H03K 19/00* | (2006.01) |
| *H03K 19/003* | (2006.01) |

(52) U.S. Cl.
CPC ..... *G01R 31/2851* (2013.01); *G01R 27/2605* (2013.01); *G06F 1/263* (2013.01); *G06F 1/3287* (2013.01); *H03K 19/0013* (2013.01); *H03K 19/00315* (2013.01)

(58) Field of Classification Search
USPC ....... 324/686, 658, 548, 649, 659, 660, 661, 324/600; 307/39, 115, 125; 327/143, 327/434, 540, 337, 374; 323/271, 282, 323/242, 272, 285; 365/149; 330/253; 714/724–730; 713/300–320, 323
See application file for complete search history.

(56) References Cited

U.S. PATENT DOCUMENTS

| | | | |
|---|---|---|---|
| 7,009,460 B2 | 3/2006 | Wilcox | |
| 7,119,398 B1* | 10/2006 | Bakker | G11C 5/147 257/335 |
| 7,859,355 B2 | 12/2010 | Brennan et al. | |
| 7,948,263 B2 | 5/2011 | Kim et al. | |
| 2001/0015658 A1* | 8/2001 | Kousai | H03K 19/0005 326/104 |
| 2006/0114247 A1* | 6/2006 | Brown | G02F 1/13338 345/204 |

(Continued)

FOREIGN PATENT DOCUMENTS

| | | |
|---|---|---|
| EP | 2003534 A2 | 12/2008 |
| WO | 2009144661 A1 | 12/2009 |

OTHER PUBLICATIONS

Ireneusz et al., "A new Approach to power estimation and reduction in CMOS digital circuits", Jun. 8, 2008, Integration, the VLSI Journal 41; pp. 219-237.*

(Continued)

*Primary Examiner* — Melissa Koval
*Assistant Examiner* — Nasima Monsur
(74) *Attorney, Agent, or Firm* — Loza & Loza LLP

(57) ABSTRACT

Techniques for estimating state-dependent capacitance of a circuit are described herein. In one embodiment, a method for determining a circuit state for a circuit comprises determining a capacitance of the circuit for each one of a plurality of circuit states, and selecting one of the circuit states based on the determined capacitances.

14 Claims, 7 Drawing Sheets

(56) References Cited

U.S. PATENT DOCUMENTS

2008/0256376 A1 10/2008 You et al.
2010/0219866 A1 9/2010 Chen
2011/0018558 A1* 1/2011 Saito .................. G06F 3/0338
                                              324/676

OTHER PUBLICATIONS

Ireneusz et al., "power dissipation reduction during synthesis of two level logic based on probability of input vectors changes", 2005, pp. 456-465.*
Brzozowski I., et al., "A New Approach to Power Estimation and Reduction in CMOS Digital Circuits", Integration, The VLSI Journal, North-Holland Publishing Company, Amsterdam, NL, Nov. 12, 2007 (Nov. 12, 2007), vol. 41, No. 2, pp. 219-237, XP022339813, ISSN: 0167-9260, DOI: 10.1016/J.VLSI.2007.06.003.
Brzozowski I., et al., "Power Dissipation Reduction During Synthesis of Two-Level Logic Based on Probability of Input Vectors Changes" Aug. 20, 2005 (Aug. 20, 2005), Integrated Circuit and System Design; [Lecture Notes in Computer Science;;LNCS] Springer-Verlag, Berlin/Heidelberg, pp. 456-465, XP019015936, ISBN: 978-3-540-29013-1 the whole document.
Chen S-H., et al., "Implementation and verification practices of DVFS and power gating", VLSI Design, Automation and Test, 2009. VLSI-DAT'09. International Symposium on, IEEE, Piscataway, NJ, USA, Apr. 28, 2009 (Apr. 28, 2009), pp. 19-22, XP031485218, ISBN: 978-1-4244-2781-9.
International Search Report and Written Opinion—PCT/US2015/011758—ISA/EPO—Jun. 16, 2015.
Wang J-H., et al., "Time-Domain Current Waveform Simulation for CMOS VLSI Circuits Using Charge-Based Model", The International Journal of Microcircuits and Electronic Packaging, International Microelectronics & Packaging Society, US, Sep. 21, 1999 (Sep. 21, 1999), vol. 22, No. 4, pp. 334-344, XP000912657, ISSN: 1063-1674.
Chen S.H., et al., "Power-Up Sequence Control for MTCMOS Designs," IEEE Transactions on Very Large Scale Integration (VLSI) Systems, vol. 21 (3), Mar. 2013, pp. 413-423.

* cited by examiner

STATE-DEPENDENT CAPACITANCE ESTIMATION

BACKGROUND

Field

Aspects of the present disclosure relate generally to power gating, and more particularly, to state-dependent capacitance estimation for power-gating applications.

Background

A power distribution network (PDN) may be used to distribute power from a power supply (e.g., a battery) to various circuits on a die. To conserve power, the PDN may employ powering gating, in which the PDN disconnects a circuit from the power supply when the circuit is inactive to prevent power leakage from the circuit. As the dimensions of circuits scale down into the deep nanometer range, power leakage significantly increases. Therefore, power gating is becoming increasing important to reduce power consumption and extend the battery life of mobile devices.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to a first aspect, a method for determining a circuit state for a circuit is described herein. The method comprises determining a capacitance of the circuit for each one of a plurality of circuit states, and selecting one of the circuit states based on the determined capacitances.

A second aspect relates to an apparatus for placing a circuit in a circuit state, wherein the circuit comprises a plurality of inputs. The apparatus comprises a plurality of input drivers, wherein each of the input drivers is configured to drive a respective one of the plurality of inputs. The apparatus also comprises an input controller configured to control the plurality of input drivers such that, during power up of the circuit, the input drivers drive the plurality of inputs according to a combination of input logic states that places the circuit in the circuit state. The circuit state is one of a plurality of circuit states corresponding to a plurality of different capacitances, and the circuit state corresponds to a lowest one of the plurality of capacitances.

A third aspect relates to a method for powering up a circuit. The method comprises placing the circuit in a circuit state, wherein the circuit state is one of a plurality of circuit states corresponding to a plurality of different capacitances, and the circuit state corresponds to a lowest one of the plurality of capacitances. The method also comprises connecting the circuit to a power supply while the circuit is in the circuit state.

A fourth aspect relates to an apparatus for powering up a circuit. The apparatus comprises means for placing the circuit in a circuit state, wherein the circuit state is one of a plurality of circuit states corresponding to a plurality of different capacitances, and the circuit state corresponds to a lowest one of the plurality of capacitances. The apparatus also comprises means for connecting the circuit to a power supply while the circuit is in the circuit state.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
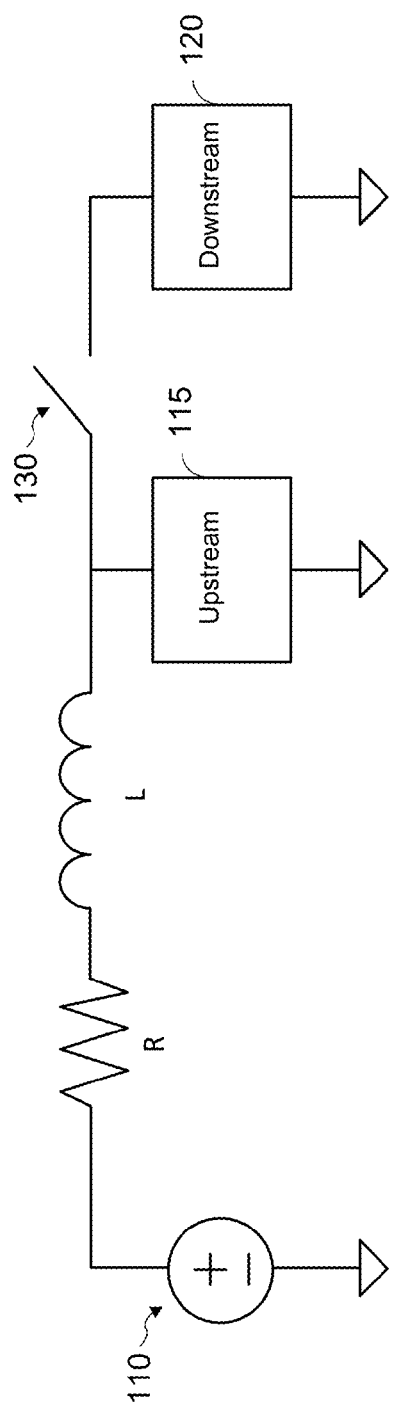
FIG. 1 shows an example of a power distribution network (PDN) for distributing power to an upstream circuit and a downstream circuit.

FIG. 1 shows an example of a power distribution network (PDN) for distributing power from a DC power supply 110 to an upstream circuit 115 and a downstream circuit 120. The inductor L and the resistor R in FIG. 1 model inductance and resistance, respectively, of board and packaging interconnects between the power supply 110 and the circuits 115 and 120. The upstream circuit 115 and the downstream circuit 120 may be located on the same die.

The PDN may employ power gating to conserve power. In this regard, the PDN includes a power switch 130 for selectively connecting the downstream circuit 120 to the power supply 110. When the downstream circuit 120 is active, the power switch 130 is turned on to supply power to the downstream circuit 120, and when the downstream circuit 120 is inactive, the power switch 130 is turned off to disconnect the power supply 110 from the downstream circuit 120. This reduces power leakage from the downstream circuit 120 when the downstream circuit 120 is inactive, thereby conserving power.

When the downstream circuit 120 is inactive, capacitors in the downstream circuit 120 have approximately no charge due to power leakage. The capacitors may include parasitic-wire capacitors and parasitic capacitors of transistors in the downstream circuit 120. Because the capacitors in the downstream circuit 120 have approximately no charge in the inactive state, when the power switch 130 is first turned on, the downstream circuit 120 consumes charge to charge up the capacitors in the downstream circuit 120. The charge comes from the upstream circuit 115 and the power supply 110.

The charge from the upstream circuit 115 is provided by capacitors in the upstream circuit 115, which may be charged up to the nominal supply voltage (approximately equal to the voltage of the power supply 110). When the power switch 130 is first turned on, a large amount of charge flows from the capacitors in the upstream circuit 115 to the capacitors in the downstream circuit 120 through the switch 130. This is because the capacitors in the upstream circuit 115 are at a higher potential than the capacitors in the downstream circuit 120. The transfer of charge causes the voltage at the upstream circuit 115 to droop from the nominal supply voltage. This is because the power supply 110 is not able to supply charge fast enough to the upstream circuit 115 and the downstream circuit 120 to prevent the droop due to the PDN inductance between the power supply 110 and the circuits 115 and 120. The voltage droop can potentially case logic in the upstream circuit 115 to malfunction.

To constrain the voltage droop within an acceptable limit (e.g., 5% of the supply voltage), the power switch 130 may be implemented using a variable-resistance switch. When the switch is first turned on, the switch has a high resistance to limit the rate of charge transfer from the upstream circuit 110 to the downstream circuit 120, and therefore reduce the voltage droop. When the downstream circuit 120 rises to a voltage close to the nominal supply voltage, the resistance of the switch becomes low to minimize the IR voltage-drop across the switch 130 while the downstream circuit 120 is in the active state.

The variable-resistance power switch 130 may be implemented using a plurality of switches coupled in parallel. To awaken the downstream circuit 120, the switches may be turned on over a period of time, in which the resistance of the power switch 130 decreases as more switches are turned on. In one example, the switches may include one or more weak switches (high-resistance switches) and one or more strong switches (low-resistance switches). In this example, the weak switches may be turned on first to prevent a large voltage droop while the strong switches may be turned on when the voltage of the downstream circuit 120 settles to a value close to the nominal supply voltage.

The wakeup time for the downstream circuit 120 depends on the amount of charge needed to power up the downstream circuit 120, which, in turn, depends on the capacitance of the downstream circuit 120 during power up. The lower the capacitance, the lower the amount of charge needed to power up the downstream circuit 120, and therefore the faster the wakeup time. Accordingly, it is desirable to reduce the capacitance of the downstream circuit 120 during power up to reduce the wakeup time.

Embodiments of the present disclosure provide techniques for estimating a state-dependent capacitance of a downstream circuit 120, as seen by a PDN. During power up, the downstream circuit 120 may be placed in the state resulting in the lowest capacitance to reduce wakeup time, as discussed further below.

Figure 2:
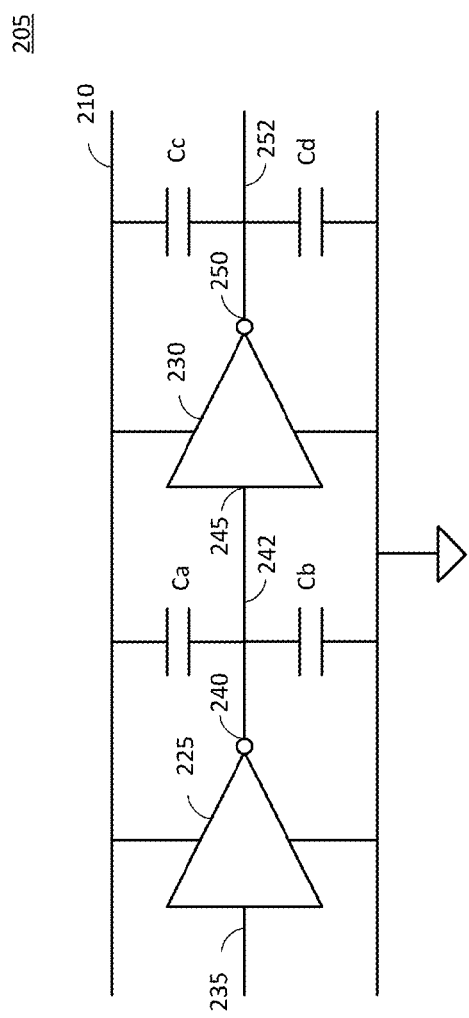
FIG. 2 shows an example of a circuit with parasitic-wire capacitors.

In one embodiment, the state-dependent capacitance of a circuit due to parasitic capacitors in the circuit is determined. The parasitic capacitors may be formed by wires in the circuit interconnecting devices in the circuit. In this regard, FIG. 2 shows an example of a circuit 205 comprising a first inverter 225 and a second inverter 230. The circuit 205 may be part of a larger downstream circuit 120.

The inverters 225 and 230 receive power from the supply rail 210, which is coupled to the power switch 130 (not shown in FIG. 2) used for power gating the circuit 205. In this example, the output 240 of the first inverter 225 is coupled to the input 245 of the second inverter 230 by a first wire 242 with a parasitic-wire capacitor Ca between the wire 242 and the rail 210, and a parasitic-wire capacitor Cb between wire 242 and ground. The output 250 of the second inverter 230 is coupled to another device (not shown) by a second wire 252 with a parasitic-wire capacitor Cc between the wire 252 and the supply rail 210, and a parasitic-wire capacitor Cd between the wire 252 and ground.

In this example, each of the parasitic-wire capacitors Ca, Cb, Cc and Cd has a logic one state or a logic zero state during power up depending on the logic state of the inverter driving the respective wire. More particularly, when the input 235 of the first inverter 225 is driven high, the first inverter 225 forms a low impedance path between the output 240 of the first inverter 225 and ground to pull the first wire 242 to ground. As a result, the logic state of parasitic capacitor Ca is one and the logic state of parasitic capacitor Cb is zero. This is because, during power up, the PDN needs to charge up parasitic capacitor Ca to the supply voltage, but not parasitic capacitor Cb since both terminals of parasitic capacitor Cb are grounded.

When the input 235 of the first inverter 225 is driven low, the first inverter 225 forms a low impedance path between the output 240 of the first inverter 225 and the supply rail 210 to pull up the first wire 242. As a result, the logic state of parasitic capacitor Ca is zero and the logic state of parasitic capacitor Cb is one. This is because, during power up, the PDN needs to charge up parasitic capacitor Cb to the supply voltage, but not parasitic capacitor Ca since parasitic capacitor Ca is in parallel with the low impedance path of the first inverter 225.

When the input 245 of the second inverter 230 is driven high, the second inverter 230 forms a low impedance path between the output 250 of the second inverter 230 and ground to pull the second wire 252 to ground. As a result, the logic state of parasitic capacitor Cc is one and the logic state of parasitic capacitor Cd is zero. When the input 245 of the second inverter 230 is driven low, the second inverter 230 forms a low impedance path between the output 250 of the second inverter 230 and the supply rail 210 to pull up the second wire 252. As a result, the logic state of parasitic capacitor Cc is zero and the logic state of parasitic capacitor Cd is one.

When the logic state of a parasitic capacitor is one, the PDN sees the capacitance of the parasitic capacitor, and, when the logic state of a parasitic capacitor is zero, the PDN does not see the capacitance of the parasitic capacitor. Thus, the total parasitic capacitance of the circuit 205 seen by the PDN can be expressed as:

$$C_{total_{parasitic}} = Ca*State\_a + Cb*state\_b + Cc*state\_c + Cd*state\_d \quad (1)$$

where state_a is the logic state of parasitic capacitor Ca, state_b is the logic state of parasitic capacitor Cb, state_c is the logic state of parasitic capacitor Cc, and state_d is the logic state of parasitic capacitor Cd. In this example, there are only two possible combinations of logic states for parasitic capacitors Ca, Cb, Cc and Cd. This is because the first and second inverters 225 and 230 are driven in opposite states since the output of the first inverter 225 is coupled to the input of the second inverter 230. For the first combination of states, the input 235 of the first inverter 225 is driven high and the input 245 of the second inverter 230 is driven low. In this case, state_a is one, state_b is zero, state_c is zero, and state_d is one, and the total parasitic capacitance of the circuit 205 seen by the PDN is Ca+Cd. For the second combination of states, the input 235 of the first inverter 225 is driven low and the input 245 of the second inverter 230 is driven high. In this case, state_a is zero, state_b is one, state_c is one, and state_d is zero, and the total parasitic capacitance of the circuit 205 seen by the PDN is Cb+Cc.

Thus, the total parasitic capacitance of the circuit 205 seen by the PDN depends on the logic states of parasitic capacitors Ca, Cb, Cc and Cd. The total parasitic capacitance may be minimized by determining which of the two possible combinations of logic states discussed above results in the lowest total parasitic capacitance. Equation (1) can be generalized to determine the total parasitic capacitance of a circuit seen by a PDN as follows:

$$C_{total\_}^{parasitic} = \Sigma_{n=1}^{n=N} C_{parasitic\_}n * state\_n \quad (2)$$

where the circuit comprises N parasitic capacitors, $C_{parasitic\_}n$ is the capacitance of the nth parasitic capacitor in the circuit, and state_n is the logic state of the nth parasitic capacitor. Thus, the total parasitic capacitance in equation (2) is given by the summation of the capacitances of the parasitic capacitors in the circuit multiplied by their respective states.

Equation (2) can be used to determine the state-dependent parasitic capacitance of a circuit. It is to be appreciated that equation (2) provides the state-dependent parasitic capacitance of the circuit seen by the PDN after the supply rail of the circuit has reached a sufficient voltage to turn on the active devices (e.g., inverters, NOR gates, NAND gates, and/or other logic devices) that drive the wires forming the parasitic capacitors. This voltage may be approximately equal to a threshold voltage of transistors in the active devices.

Figure 3B:
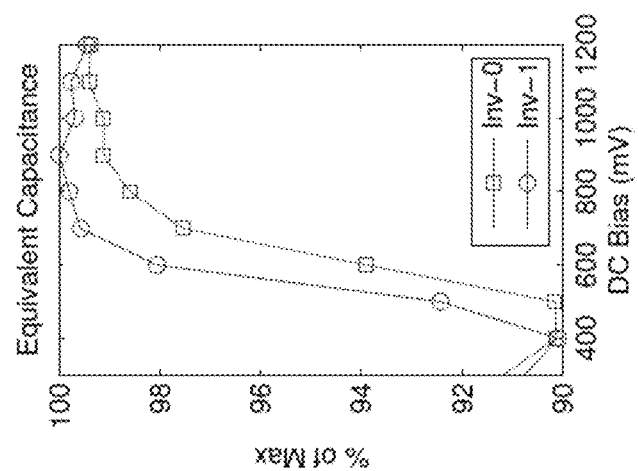
FIG. 3B is a plot showing voltage-dependent capacitances of the inverter for two different input states according to embodiment of the present disclosure.
Figure 3A:
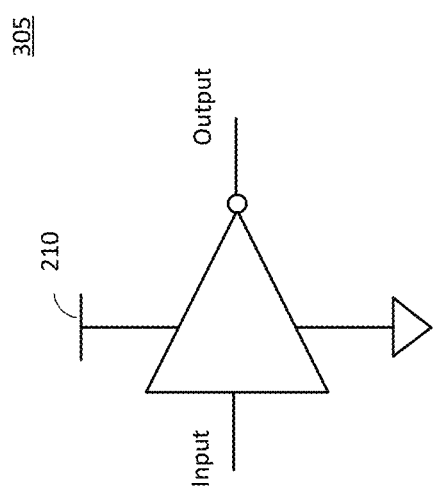
FIG. 3A shows an inverter according to an embodiment of the present disclosure.

In another embodiment, the state-dependent capacitance of a circuit due to capacitances of active devices in the circuit is determined. In this regard, FIG. 3A shows an example of an inverter 305 that can be driven into two different logic states: one state in which the inverter input is logic one, and another state in which the inverter input is logic zero. FIG. 3B is a plot showing the capacitance of the inverter 305 for the two different logic states as a function of voltage at the supply rail 210. As can be seen in FIG. 3B, the capacitance of the inverter 305 is different for the two states, and is therefore state dependent.

Figure 4B:
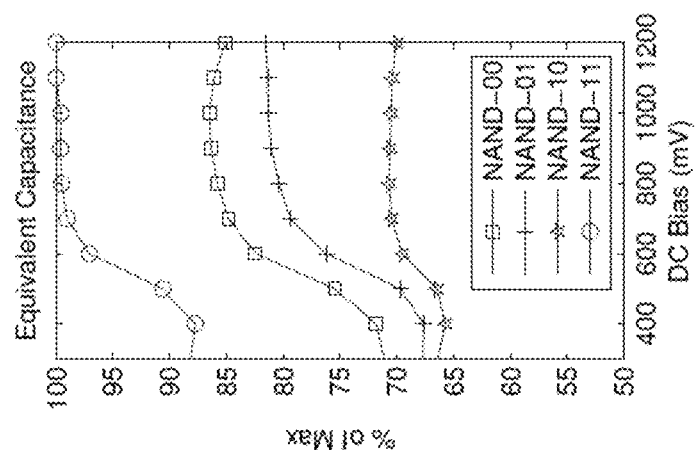
FIG. 4B is a plot showing voltage-dependent capacitances of the two-input NAND gate for four different input states according to embodiment of the present disclosure.
Figure 4A:
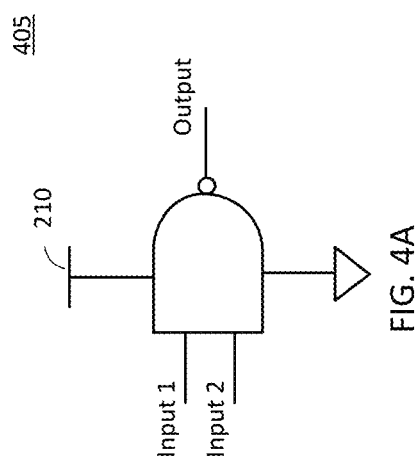
FIG. 4A shows a two-input NAND gate according to an embodiment of the present disclosure.

FIG. 4A shows an example of a two-input NAND gate 405 that can be driven into four different logic states: one in which both inputs are driven low (logic state 00), one in which both inputs are driven high (logic state 11), and two in which the inputs are oppositely driven (logic state 01 and logic state 10). FIG. 4B is a plot showing the capacitance of the NAND gate 405 for the four different logic states as a function of voltage at the supply rail 210. As can be seen in FIG. 4B, the capacitance of the NAND gate 405 is different for the four states, and is therefore state dependent.

Figure 5B:
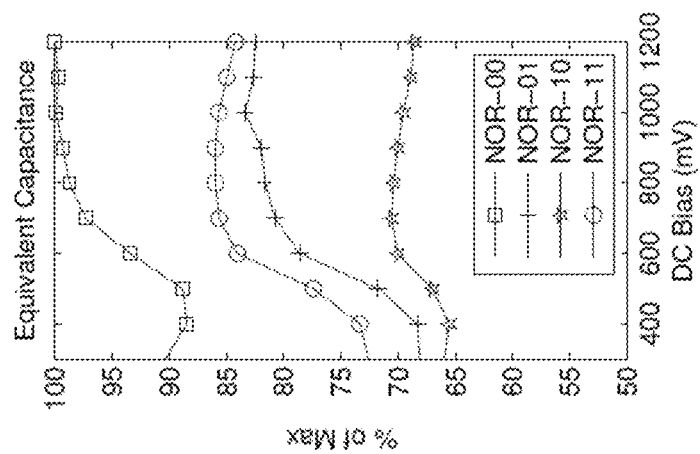
FIG. 5B is a plot showing voltage-dependent capacitances of the two-input NOR gate for four different input states according to embodiment of the present disclosure.
Figure 5A:
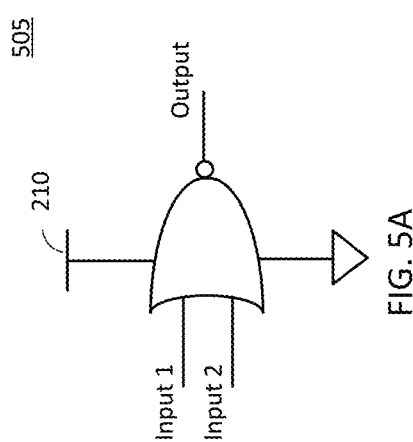
FIG. 5A shows a two-input NOR gate according to an embodiment of the present disclosure.

FIG. 5A shows an example of a two-input NOR gate 505 that can be driven into four different logic states: one in which both inputs are driven low (logic state 00), one in which both inputs are driven high (logic state 11), and two in which the inputs are oppositely driven (logic state 01 and logic state 10). FIG. 5B is a plot showing the capacitance of the NOR gate 505 for the four different logic states as a function of voltage at the supply rail 210. As can be seen in FIG. 5B, the capacitance of the NOR gate 505 is different for the four states, and is therefore state dependent.

The capacitances for the exemplary inverter 305, the NAND gate 405, and the NOR gate 505 discussed above were characterized using modeling techniques disclosed in application Ser. No. 14/157,451, titled "Voltage Dependent Die RC Modeling For System Level Power Distribution Networks," filed on Jan. 16, 2014, the entire specification of which is incorporated herein by reference.

Thus, the above examples demonstrate that the capacitances of active devices in a circuit are state dependent. The total parasitic capacitance of a circuit seen by a PDN due to active devices in the circuit may be given by:

$$C_{total\_}^{device} = \Sigma_{m=1}^{m=M} C_{device\_}m@state\_m \quad (3)$$

where the circuit comprises M active devices, $C_{device\_}m@state\_m$ is the capacitance of the mth active device evaluated at its state. Thus, the total capacitance of the circuit due to active devices is given by the summation of the capacitances of the active devices evaluated at their respective states.

As shown in the examples in FIGS. 4B, 5B and 6B, the capacitance of an active device at a particular state may also be voltage dependent. To simplify equation (3), the capacitance of an active device evaluated at a particular state (i.e., $C_{device\_}m@state\_m$) may be given by the maximum capacitance of the active device for that state over a certain voltage range. For example, the capacitance of the inverter 305 evaluated at a particular state may be given by the maximum capacitance of the inverter 305 for that state in the plot shown in FIG. 3B. The voltage range may be between any voltage less than the nominal supply voltage and a voltage equal to or slightly greater than the nominal supply voltage.

The state-dependent capacitance of a circuit due to both active devices and parasitic capacitors may be determined by summing equations (2) and (3), resulting in the following equation:

$$C_{total} = \Sigma_{m=1}^{m=M} C_{device\_}m@state\_m + \Sigma_{n=1}^{n=N} C_{parasitic\_}n * state\_n \quad (4).$$

Equation (4) may be used to estimate the state-dependent capacitance of the downstream circuit 120, and therefore the amount of charge needed to power up the downstream circuit to the nominal supply voltage for a particular circuit state, where the circuit state corresponds to a combination of active-device states and parasitic-capacitor states in the circuit.

For a large downstream circuit 120 comprising many active devices, the computation may be made more manageable by estimating the state-dependent capacitance for a representative portion of the downstream circuit 120 based on equation (4), and using the estimated state-dependent capacitance for the representative portion to estimate the state-dependent capacitance for the entire downstream circuit 120. For example, the estimated state-dependent capacitance for the portion of the downstream circuit 120 may be divided by the area of the portion of the circuit to determine a state-dependent capacitance density (capacitance per unit area) for the downstream circuit 120. The state-dependent capacitance for the entire downstream circuit 120 may then be estimated by multiplying the state-dependent capacitance density by the total area of the downstream circuit 120.

After the state-dependent capacitance of the downstream circuit 120 is determined, the capacitance of the downstream circuit 120 may be estimated for a plurality of different circuit states, where each circuit state corresponds to a different combination of active-device states and parasitic-capacitor states in the circuit. When the downstream circuit 120 is to be powered up, the downstream circuit 120 may be placed in the circuit state resulting in the lowest capacitance for the downstream circuit 120 to reduce the amount of charge needed to power up the circuit to the supply voltage, and therefore the wakeup time of the circuit. It is to be appreciated that the plurality of different circuit states may be a subset of all possible circuit states of the circuit. Thus, the lowest capacitance discussed above may be the lowest capacitance for the plurality of circuit states that are evaluated, and not necessary the absolute lowest capacitance for the downstream circuit 120.

Figure 6:
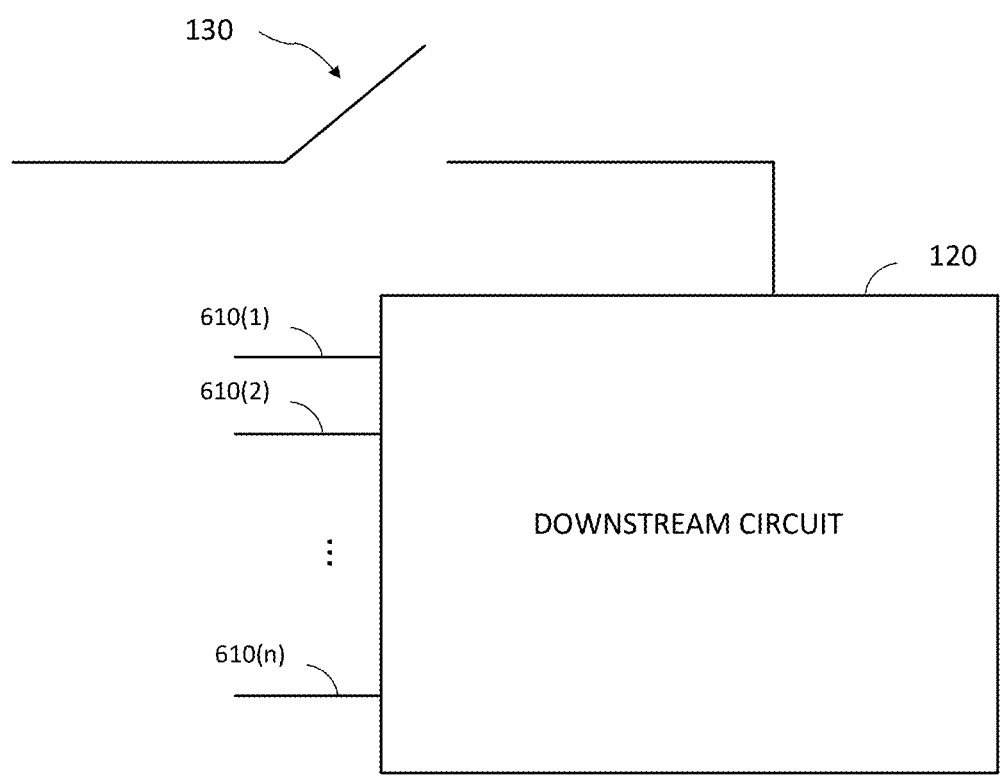
FIG. 6 shows a downstream circuit with a plurality of inputs according to embodiment of the present disclosure.

In one embodiment, the downstream circuit 120 may have a plurality of inputs 610(1)-610(n), as shown in the FIG. 6. Although FIG. 6 shows the downstream circuit 120 having inputs 610(1)-610(n) on one side for ease of illustration, it is to be appreciated that downstream circuit 120 may have inputs on multiple sides. Each input 610(1)-610(n) may be configured to receive a signal from an external device, where the external device may be on the same die as the downstream circuit 120 or a different die. It is to be appreciated that an input for the downstream circuit 120 may also serve as an output for the downstream circuit 120 (e.g., for bi-directional communication).

When the downstream circuit 120 is to be powered up, the inputs 610(1)-610(n) of the downstream circuit 120 may be driven to any one of a plurality of different combinations of input logic states. Each combination of input logic states places the downstream circuit 120 in a particular circuit state corresponding to a particular combination of active-device states and parasitic-capacitor states in the circuit.

Thus, the set of possible circuit states into which the downstream circuit 120 may be placed may be limited by the different combinations of input logic states for the inputs 610(1)-610(n). For n inputs 610(1)-610(n), the number of combinations of input logic states may be approximately $2^n$, in which case the number of possible circuit states may also be approximately $2^n$. For each combination of input logic states, a circuit simulation may be performed on the downstream circuit 120 to determine the states of internal nodes in the circuit resulting from the combination of input logic states, and therefore the circuit state resulting from the combination of input logic states. Thus, the circuit simulation may be used to determine the set of circuit states corresponding to the different combinations of input logic states.

In this embodiment, the capacitance of the downstream circuit 120 may be estimated for each circuit state in the set of possible circuit states based on equation (4). After the capacitance is estimated for each circuit state, the circuit state resulting in the lowest capacitance may be determined. When the downstream circuit 120 is to be powered up, the inputs 610(1)-610(n) of the downstream circuit 120 may be set to the combination of input logic states that places circuit in the determined circuit state to reduce wakeup time.

Figure 7:
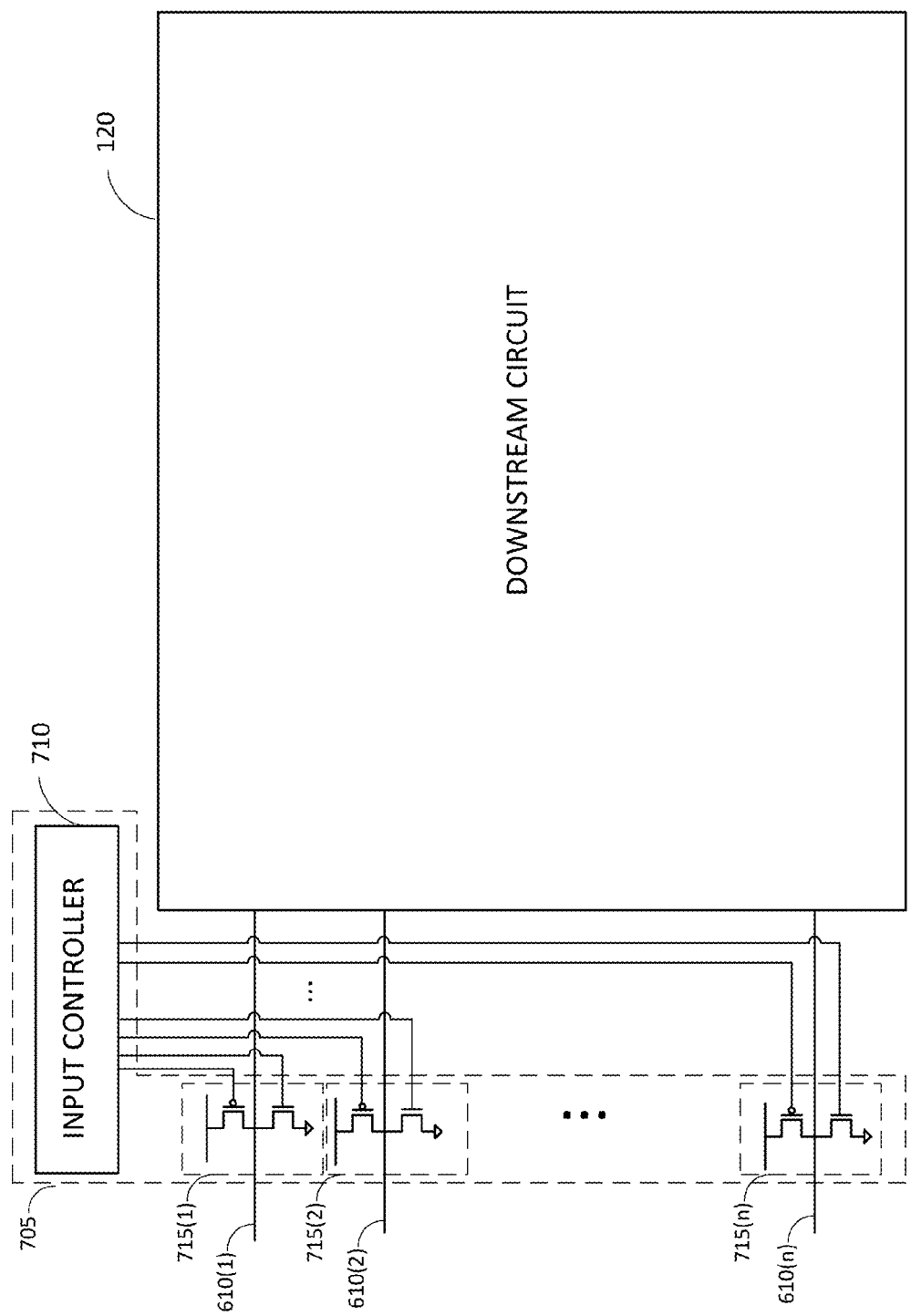
FIG. 7 shows a circuit for setting the logic states of the inputs of the downstream circuit according to embodiment of the present disclosure.

In this regard, FIG. 7 shows a circuit 705 for setting the input logic states of the inputs 610(1)-610(n) according to an embodiment of the present disclosure. The circuit 705 comprises an input controller 710 and a plurality of input drivers 715(1)-715(n), where each input driver 715(1)-715(n) is configured to drive a respective one of the inputs 610(1)-610(n) to a desired input logic state.

As shown in FIG. 7, each input driver 715(1)-715(n) may comprise a P-type field effect transistor (PFET) coupled between a supply rail and the respective input 610(1)-610(n), and an N-type field effect transistor (NFET) coupled between the respective input 610(1)-610(n) and ground. The supply rail may be coupled to the power supply 110. In this embodiment, an input 610(1)-610(n) of the downstream circuit 120 may be set to an input logic state of one by driving the gates of the PFET and NFET in the respective input driver 715(1)-715(n) low (logic zero). An input 610(1)-610(n) of the downstream circuit 120 may be set to an input logic state of zero by driving the gates of the PFET and NFET in the respective input driver 715(1)-715(n) high (logic one).

When the downstream circuit 120 is to be powered up, the input controller 710 may set the input logic states of the inputs 610(1)-610(n) according to the combination of input logic states that places the circuit in the determined circuit state discussed above. The input controller 710 may do this driving the gates of the PFET and NFET in each input driver 715(1)-715(n) according to the desired input logic state for the respective input 610(1)-610(n). For example, the input controller 710 may set a particular input 610(1)-610(n) to an input logic state of one by driving the gates of the PFET and NFET in the respective input driver 715(1)-715(n) low (logic zero). Conversely, the input controller 710 may set a particular input 610(1)-610(n) to an input logic state of zero by driving the gates of the PFET and NFET in the respective input driver 715(1)-715(n) high (logic one).

After the downstream circuit 120 has been powered up, the input controller 710 may turn off the input drivers 715(1)-715(n) to allow one or more external devices (not shown) to drive the inputs 610(1)-610(n) while the downstream circuit 120 is in the active state. The input controller 710 may turn off each input driver 715(1)-715(n) by driving the respective PFET high and the respective NFET low.

Figure 8:
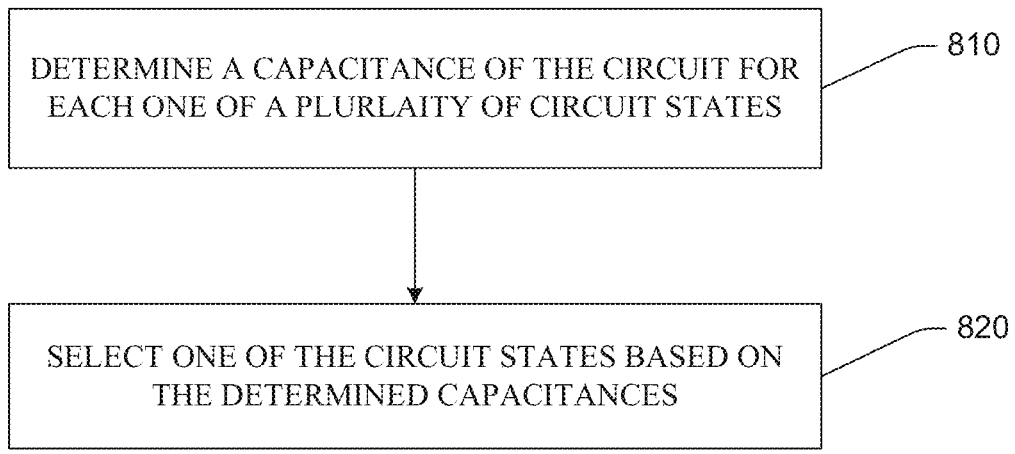
FIG. 8 is a flow diagram of a method for determining a state for a circuit according to embodiment of the present disclosure.

FIG. 8 is a flow diagram showing a method 800 for determining a circuit state for a circuit according to an embodiment of the present disclosure.

In step 810, a capacitance of the circuit is determined for each one of a plurality of circuit states. For example, the capacitance of the circuit (e.g., downstream circuit 120) may be determined for each one of the plurality of circuit states using equation (4), where each circuit state corresponds to a combination of active-device states and parasitic-capacitor states in the circuit.

In step 820, one of the circuit states is selected based on the determined capacitances. For example, the circuit state corresponding to the lowest one of the determined capacitances may be selected.

Figure 9:
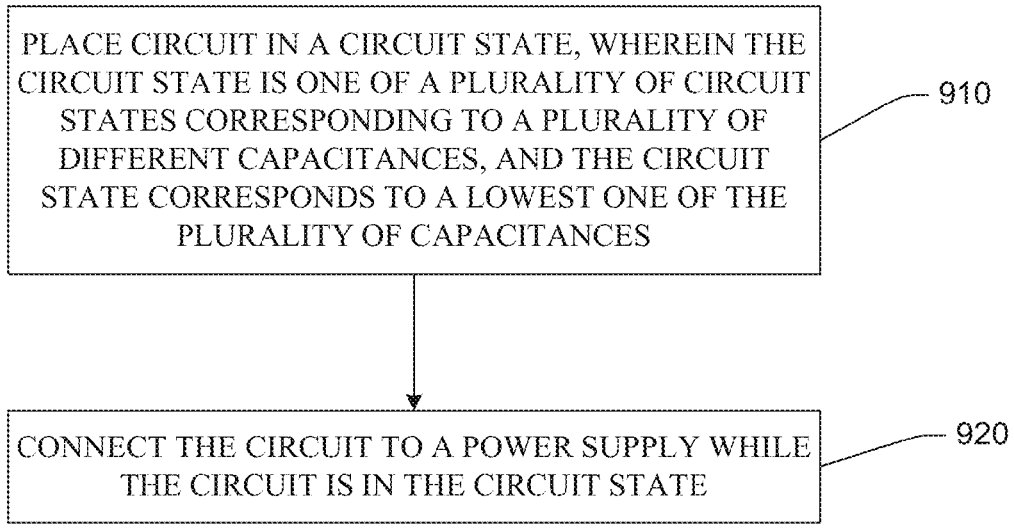
FIG. 9 is a flow diagram of a method for powering up a circuit according to an embodiment of the present disclosure.

FIG. 9 is a flow diagram of a method 900 for powering up a circuit according to an embodiment of the present disclosure.

In step 910, the circuit is placed in a circuit state, wherein the circuit state is one of a plurality of circuit states corresponding to a plurality of different capacitances, and the circuit state corresponds to a lowest one of the plurality of capacitances. For example, the circuit (e.g., downstream circuit 120) may be placed in the circuit state by driving the inputs of the circuit (e.g., using the input drivers 715(1)-715(n)) according to a combination of input logic states that places the circuit in the circuit state.

In step 920, the circuit is connected to a power supply while the circuit is in the circuit state. For example, the circuit may be connected to the power supply (e.g., power supply 110) by a power switch (e.g., power switch 130) to power up the circuit to a nominal supply voltage.

Thus, the state-dependent capacitance estimation provided by equation (4) may be used to determine a combination of input logic states for the downstream circuit 120 that places the downstream circuit 120 in a circuit state that reduces the capacitance of the downstream circuit 120 during power up. The combination of input logic states may be input to a power-gating verification flow. More particularly, the input states of a circuit simulation of the downstream circuit 120 used in the verification flow may be set according to the determined combination of input logic states. This establishes the states of active devices and parasitic capacitors in the circuit simulation.

Once the states of the active devices and the parasitic capacitors are established, the voltage-dependent capacitance of the downstream circuit 120 may be modeled based on the states and modeling techniques disclosed in application Ser. No. 14/157,451 discussed above. The voltage-dependent capacitance model of the downstream circuit 120 may be used in the power-gating verification flow to determine, for example, the resistances of switches to be used in the power switch 130 and the timing of the switches (i.e., when each switch is turned on during power up).

In the above examples, the state-dependent capacitance of the downstream circuit 120 is determined Equation (4) may also be used to determine the state-dependent capacitance of the upstream circuit 115. In this case, instead of determining the circuit state resulting in the lowest capacitance, the circuit state resulting in the highest capacitance is determined. This is because the wakeup time for the downstream circuit 120 depends in part on the amount of charge that can be supplied by the upstream circuit 115, which, in turn, depends on the capacitance of the upstream circuit 115. The higher the capacitance of the upstream circuit 115, the greater the amount of charge that can be supplied by the upstream circuit 115, and therefore the faster the wakeup time. In this embodiment, the capacitance of the upstream circuit 115 may be determined for each one of a plurality of different circuit states. Just prior to the downstream circuit 120 being powered up, the upstream circuit 115 may be placed in the circuit state resulting in the highest capacitance.

Those skilled in the art will appreciate that the various illustrative blocks, and steps described in connection with the disclosure herein may be implemented as electronic hardware, computer software, or combinations of both. To clearly illustrate this interchangeability of hardware and software, various illustrative components, blocks, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

For example, the input controller 710 may be implemented with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A method for determining a circuit state for a circuit, comprising:
    determining a capacitance of the circuit for each one of a plurality of circuit states;
    selecting one of the circuit states corresponding to a lowest one of the determined capacitances; and
    placing the circuit in the selected circuit state while powering up the circuit by connecting the circuit to a power supply with a power switch;
    wherein the circuit comprises a plurality of input drivers, and the method further comprises determining a combination of input logic states for the inputs that places the circuit in the selected circuit state using the input drivers.

2. The method of claim 1, wherein each circuit state corresponds to a different combination of active-device states and parasitic-capacitor states in the circuit.

3. The method of claim 1, wherein determining the capacitance of the circuit for each one of the plurality of circuit states comprises:
    determining a state for each one of a plurality of devices in the circuit;
    determining a capacitance for each device based on the determined state for the device; and
    summing the determined capacitances for the plurality of devices.

4. The method of claim 1, wherein determining the capacitance of the circuit for each one of the plurality of circuit states comprises:
    determining a state for each one of plurality of parasitic capacitors in the circuit;
    determining a capacitance for each parasitic capacitor based on the determined state for the parasitic capacitor; and
    summing the determined capacitances for the plurality of parasitic capacitors.

5. An apparatus for placing a circuit in a circuit state, wherein the circuit comprises a plurality of inputs, the apparatus comprising:
    a plurality of input drivers, wherein each of the input drivers is configured to drive a respective one of the plurality of inputs of the circuit; and
    an input controller configured to control the plurality of input drivers such that, during power up of the circuit, the input drivers drive the plurality of inputs according to a combination of input logic states that places the circuit in the circuit state;

wherein the circuit state is a selected one of a plurality of circuit states corresponding to a plurality of different capacitances of the circuit, and the selected circuit state corresponds to a lowest one of the plurality of different capacitances.

6. The apparatus of claim 5, wherein the input controller is configured to turn off the input drivers after power up of the circuit.

7. The apparatus of claim 5, wherein each of the plurality of circuit states corresponds to a different combination of active-device states and parasitic-capacitor states in the circuit.

8. The apparatus of claim 5, wherein each input driver comprises:
   a P-type field effect transistor (PFET) coupled between the respective input and a supply rail; and
   an N-type field effect transistor (NFET) coupled between the respective input and a ground.

9. A method for powering up a circuit, comprising:
   placing the circuit in a circuit state, wherein the circuit state is one of a plurality of circuit states corresponding to a plurality of different capacitances, and the circuit state corresponds to a lowest one of the plurality of capacitances; and
   powering up the circuit by connecting the circuit to a power supply with a power switch while the circuit is in the circuit state;
   wherein the circuit comprises a plurality of input drivers, and the method further comprises determining a combination of input logic states for the inputs that places the circuit in the selected circuit state using the input drivers.

10. The method of claim 9, further comprising, after power up, ceasing driving the plurality of inputs of the circuit according to the combination of input logic states.

11. The method of claim 9, wherein each of the plurality of circuit states corresponds to a different combination of active-device states and parasitic-capacitor states in the circuit.

12. An apparatus for powering up a circuit, comprising:
   means for placing the circuit in a circuit state, wherein the circuit state is one of a plurality of circuit states corresponding to a plurality of different capacitances, and the circuit state corresponds to a lowest one of the plurality of capacitances; and
   means for powering up the circuit by connecting the circuit to a power supply with a power switch while the circuit is in the circuit state;
   wherein the means for placing the circuit in the circuit state comprises means for driving a plurality of input drivers of the circuit according to a combination of input logic states that places the circuit in the circuit state with the plurality of input drivers.

13. The apparatus of claim 12, further comprising means for ceasing driving the plurality of inputs of the circuit according to the combination of input logic states after power up.

14. The apparatus of claim 12, wherein each of the plurality of circuit states corresponds to a different combination of active-device states and parasitic-capacitor states in the circuit.

* * * * *